(12) United States Patent
Ducrey et al.

(10) Patent No.: US 12,744,518 B2
(45) Date of Patent: Sep. 22, 2026

(54) ELECTRONIC CIRCUIT FOR DETECTING FAULT OF AN OSCILLATOR AND CONTROLLING OSCILLATOR OPERATION

(71) Applicant: STMicroelectronics International N.V., Geneva (CH)

(72) Inventors: Stephane Ducrey, Voiron (FR); Jean Claude Bini, Tourrettes-sur-loup (FR)

(73) Assignee: STMicroelectronics International N.V., Geneva (CH)

( * ) Notice: Subject to any disclaimer, the term of this patent is extended or adjusted under 35 U.S.C. 154(b) by 148 days.

(21) Appl. No.: 18/750,140

(22) Filed: Jun. 21, 2024

(65) Prior Publication Data

US 2025/0007497 A1 Jan. 2, 2025

(30) Foreign Application Priority Data

Jun. 27, 2023 (FR) ...................................... 2306702

(51) Int. Cl.

*H03K 5/19* (2006.01)
*G06F 1/08* (2006.01)
*G06F 1/14* (2006.01)
*H03K 3/037* (2006.01)
*H03K 19/20* (2006.01)

(52) U.S. Cl.

CPC ............... *H03K 3/037* (2013.01); *G06F 1/08* (2013.01); *H03K 19/20* (2013.01)

(58) Field of Classification Search

CPC .. G06F 1/14; G06F 1/08; H03K 3/037; H03K 3/0315; H03K 5/19; H03K 5/153
USPC ........................ 327/199, 18, 19, 20, 21, 198
See application file for complete search history.

(56) References Cited

U.S. PATENT DOCUMENTS

| | | | | |
|---|---|---|---|---|
| 5,754,069 | A | 5/1998 | Nagaraj | |
| 6,343,050 | B1 | 1/2002 | Kwok | |
| 7,288,975 | B2 | 10/2007 | Ngo et al. | |
| 11,863,144 | B2 * | 1/2024 | Iguchi | H04B 1/1607 |
| 12,231,528 | B2 * | 2/2025 | Moon | G06F 1/04 |
| 2017/0242130 | A1 | 8/2017 | Babitch et al. | |

FOREIGN PATENT DOCUMENTS

| | | | |
|---|---|---|---|
| WO | 9212485 | A1 | 7/1992 |
| WO | 2009031060 | A2 | 3/2009 |

OTHER PUBLICATIONS

INPI Search Report and Written Opinion for priority application, FR Appl. No. 2306702, report dated Jan. 29, 2024, 8 pgs.

* cited by examiner

*Primary Examiner* — Hai L Nguyen
(74) *Attorney, Agent, or Firm* — Crowe & Dunlevy LLC

(57) ABSTRACT

An electronic circuit includes a reference clock signal generator block and functional blocks. In response to a detected failure on a signal originating from a reference frequency generator of the reference clock signal generator block, only the reference frequency generator of the reference clock signal generator block, but not the functional blocks, is reset.

17 Claims, 3 Drawing Sheets

ELECTRONIC CIRCUIT FOR DETECTING FAULT OF AN OSCILLATOR AND CONTROLLING OSCILLATOR OPERATION

PRIORITY CLAIM

This application claims the priority benefit of French Application for U.S. Pat. No. 2,306,702, filed on Jun. 27, 2023, the content of which is hereby incorporated by reference in its entirety to the maximum extent allowable by law.

TECHNICAL FIELD

The present disclosure generally concerns electronic circuits.

BACKGROUND

Electronic circuits generally comprise, for their internal processes, a reference oscillator in the form of a quartz oscillator having its crystal, when powered-on, delivering a signal having a frequency which is used as a reference to generate time sequences such as clock signals.

Reference oscillators can be sensitive, for example, to power supply variations or to environmental parameters external to the circuit, which results in transient or permanent failures. The impact of these failures on the general circuit operation raises an issue.

There is a need to obtain electronic circuits where the impact of failures of the reference oscillator is decreased.

There is a need to overcome all or part of the disadvantages of known electronic circuits.

SUMMARY

An embodiment provides an electronic circuit comprising a reference clock signal generator circuit and functional circuits; the electronic circuit being configured to only reset said reference clock signal generator circuit when a failure on a signal originating from a reference frequency generator of the reference clock signal generator circuit is detected.

An embodiment provides a method of controlling an electronic circuit comprising a reference clock signal generator circuit and functional circuits, the method comprising a step where only the reference clock signal generator circuit is reset when a failure on a signal originating from a reference frequency generator of the reference clock signal generator circuit is detected.

In an embodiment, the electronic circuit further comprises a control circuit configured to generate, when a failure on said signal originating from the reference frequency generator is detected, a signal for resetting the reference frequency generator, different from a reset signal common to said functional circuits and to said reference clock signal generator circuit.

In an embodiment, the reference clock signal generator circuit comprises a detection circuit configured to: detect whether said signal originating from the reference frequency generator exhibits a failure, and generate, at the output of the detection circuit, a failure status signal according to the result of the detection.

In an embodiment, the reference clock signal generator circuit comprises a flip-flop having: a clock input coupled to the output of the detection circuit and a reset input coupled to a first logic circuit block configured to perform an AND-type logic function between the inverse of the signal for resetting the reference frequency generator and the reset signal common to said functional circuits and to said reference clock signal generator circuit.

In an embodiment, said reference clock generator circuit comprises a control element having a reset input coupled to a second logic circuit configured to perform an AND-type logic function between a signal present on an inverted output of said flip-flop and said reset signal common to said functional circuits and to said reference clock signal generator circuit.

In an embodiment, said control element comprises an oscillator output configured to deliver a signal for controlling the reference frequency generator.

In an embodiment, the signal for controlling the reference frequency generator is configured to stop the reference frequency generator when the reset input of the control element is enabled.

In an embodiment, said control element comprises: a clock output configured to deliver a reference clock signal having the reference frequency; and a clock input configured to receive said signal originating from the reference frequency generator; the control element being configured so that the clock output delivers the reference clock signal based on the signal originating from the reference frequency generator after a given number of periods have been verified.

In an embodiment, the flip-flop is coupled to the output of the detection circuit via a third logic circuit block configured to perform an AND-type logic function between the failure status signal and a signal for enabling the detection circuit.

In an embodiment, the flip-flop comprises a data input set to state one.

In an embodiment, the flip-flop is a D-type flip-flop.

In an embodiment, the inverted output of the flip-flop is configured to be reset when the reset input is enabled.

In an embodiment, the reset input of the flip-flop is enabled when it receives a signal at 0.

In an embodiment, the reset input of the control element is enabled when it receives a signal at 0.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "edge", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1:
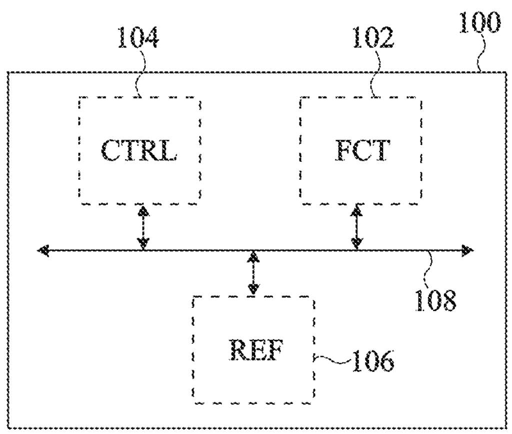
FIG. 1 very schematically shows, in the form of circuit blocks, an example of an integrated circuit.

FIG. 1 very schematically shows in the form of circuit blocks an example of an integrated circuit 100.

Circuit 100 comprises, for example, a processing circuit block 104 (CTRL) comprising one or a plurality of processors, for example under the control of instructions stored in an instruction memory (not shown).

Circuit 100 further comprises a clock circuit block 106 (REF) having a reference clock signal generation circuit comprising an oscillator generating a reference frequency.

Device 100 may integrate other circuits implementing other functions (for example, one or a plurality of volatile and/or non-volatile memories, other processing units, an input/output interface (I/O), symbolized by a functional circuit block 102 (FCT) in FIG. 1.

Circuit blocks 102, 104, and 106 are, for example, coupled to one another and/or to the rest of integrated circuit 100 via a bus 108 conveying the required signals.

Circuit blocks 102 and/or 104 and/or 106 further comprise other functional circuits. The reference clock signal generation circuit block and these functional circuits are configured to be reset by at least one reset signal common to said functional circuits and to the reference clock signal generation circuit block.

The present description more particularly relates to clock circuit block 106, the generated reference clock signal of which is for example used in the processes implemented by the other circuit blocks 102, 104.

The reference oscillator of the reference clock signal generator circuit block may be sensitive, for example, to power supply variations or to environmental parameters external to circuit 100, which results in transient or permanent failures. In current implementations, these failures result in a general restarting of circuit 100.

In the described embodiments, the circuit block 106 is configured to only reset the reference clock signal generator circuit block when a failure on a signal originating from the reference frequency generator oscillator is detected. This enables to avoid a complete restarting of circuit 100 while the failure may, for example, only be transient.

Figure 2:
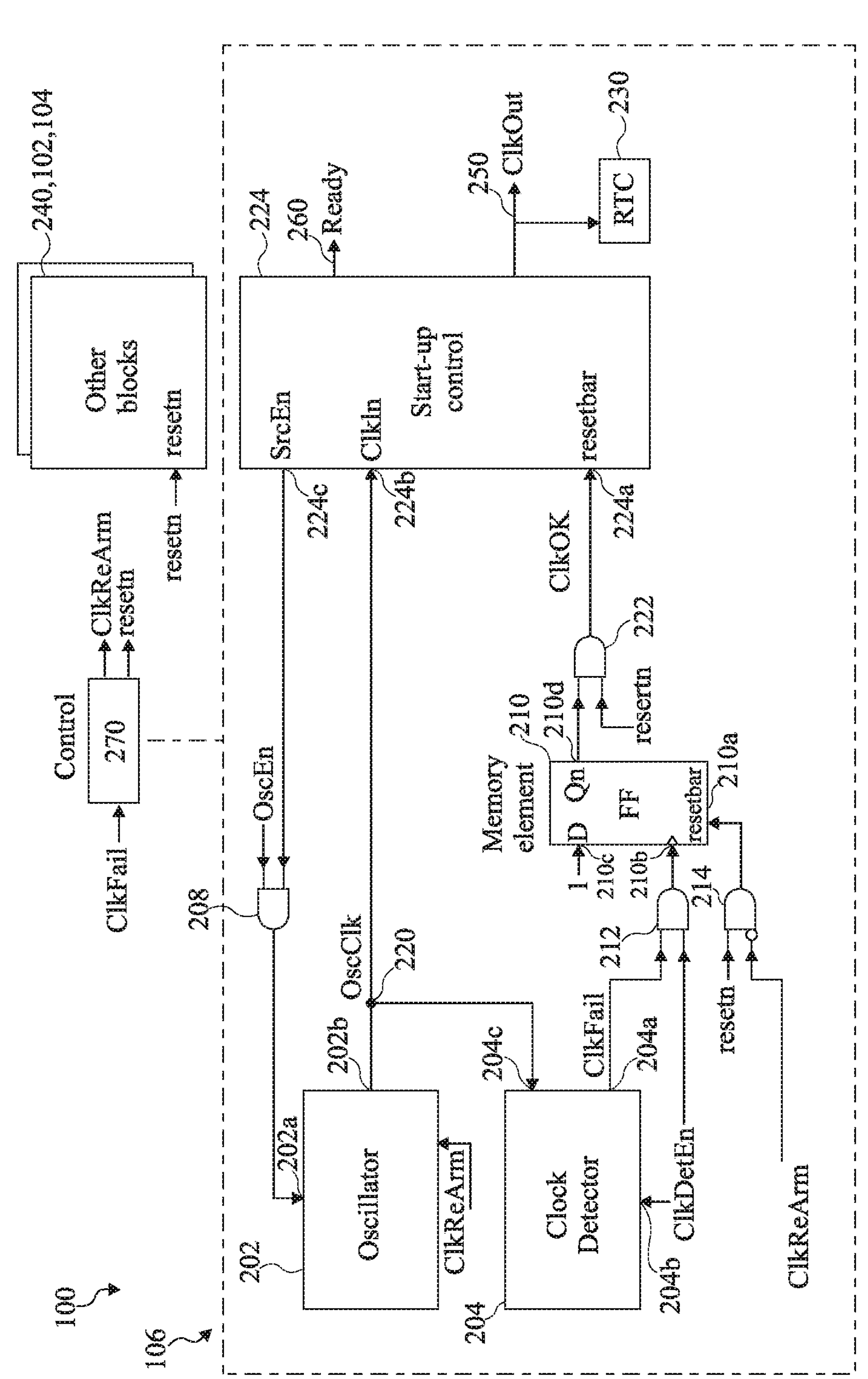
FIG. 2 very schematically shows, in the form of circuit blocks, circuit blocks of the integrated circuit of FIG. 1.

FIG. 2 very schematically shows, in the form of circuit blocks, circuit blocks of the integrated circuit 100 of FIG. 1.

More particularly, FIG. 2 describes a reference clock signal generator circuit block 106 as well as other functional circuits such as circuit blocks 102, 104 (Other circuit blocks) external to circuit block 106 or other functional circuit blocks 240 which are internal or external to circuit block 106.

Reference clock signal generator circuit block 106 comprises a reference frequency generator 202 (Oscillator) which is, for example, a crystal oscillator, for example a quartz crystal oscillator oscillating at 32,768 kHz. Under the effect, for example, of a signal applied to an input 202*a*, reference frequency generator 202 generates, on an output 202*b*, a clock signal (OscClk) having a reference frequency.

In the shown example, the reference clock signal generator circuit block further comprises a clock detection circuit 204 (Clock detector) having an input 204*c* coupled, preferably connected, to the output 202*b* of generator 202 at a node 220. Detection circuit 204 is configured to detect whether said signal OscClk originating from reference frequency generator 202 exhibits a failure, for example if a period is missing or the expected frequency is not respected, and to generate, at an output 204*a* of the detection circuit, an alert signal (ClkFail) having its state modified according to the result of the detection, for example state 0 when no failure is detected and switching to state 1 with a rising edge when a failure is detected. In an example, detection circuit 204 is a state machine. Signal ClkFail is, for example, also accessible in a register and capable of sending an event to a control unit 270, such as for example circuit block 104, to indicate to control unit 270 that a failure has occurred and record the error.

In the shown example, the start-up and the stopping of detection circuit 204 are controlled, for example, with an enable control signal (ClkDetEn).

The output 204*a* of the detection circuit and the detection circuit control signal ClkDetEn are coupled to the inputs of a logic circuit block 212 configured to perform the AND logic function from its inputs.

In the shown example, the output of logic circuit block 212 is coupled, preferably connected, to a clock input 210*b* (commonly referred to as the CP input) of a flip-flop 210 (FF, Memory element), for example of type D, and for example with a falling or rising edge detection. In the shown example, the flip-flop is provided with a rising edge detection and further comprises a reset input 210*a* (resetbar), a data input 210*c* (D), for example set to 1, and an inverted output 210*d* (Qn) conventionally referred to as Qbar. In the example of FIG. 2, the enabling of input 210*a* is performed by the detection of a falling edge when the signal switches to 0. The reset input 210*a* of flip-flop 210 is coupled, preferably connected, to an output of a logic circuit block 214 configured to perform an "AND"-type function from a reset signal (resetn) common to functional circuit blocks 102 and/or 104 and/or 240 and to reference clock generator circuit block 106 and from the inverse of a signal (ClkReArm) for resetting the reference frequency generator circuit block. The reset signal (resetn) common to functional circuit blocks 102 and/or 104 and/or 240 is, for example, at 0 when the resetting is not applied and set to 1 with a rising edge when the general resetting of circuit 100 is controlled, for example by circuit block 104.

Logic circuit block 214 is for example implemented based on combinatory logic and sequential logic. The signal for resetting reference frequency generator circuit block ClkReArm consists, for example, of a pulse controlled by a program implemented, for example, by circuit block 104.

In the shown example, reference clock signal generator circuit block 106 comprises another logic circuit block 222 configured to perform an "AND" function from the output signal 210*d* of flip-flop 210 and the reset signal (resetn) common to functional circuit blocks 102 and/or 104 and/or 240 and to reference clock generator circuit block 106.

In the shown example, reference clock generator circuit block 106 comprises a control circuit element 224 (Start-up control). Circuit block 224 is, for example, a counter-based digital circuit block. A reset input 224*a* (resetbar) of control element 224 is configured to receive an output signal (ClkOK) from logic circuit block 222. When input 224*a* receives a signal transiting through 0, then control element 224 is reset. A clock input 224*b* (ClkIn) of control element

224 is configured to receive the signal originating from the reference frequency generator (OscClk). An oscillator control output 224*c* (SrcEn) of control element 224 is coupled, preferably connected, to a logic circuit block 208 of reference clock generator circuit block 106. Logic circuit block 208 is configured to perform an "AND" function from the signal present at oscillator control output 224*c* and from a signal for enabling the oscillator (OscEn) which corresponds, for example, to a parameter determined by a user. Oscillator enable signal OscEn comprises, for example, one or a plurality of bits assigned by a user to enable or disable reference frequency generator 202. The output of logic circuit block 208 is configured to deliver a control signal to reference frequency generator 202 at its input 202*a*.

Control element 224 further comprises an output 260 delivering a signal (Ready) indicating whether the reference clock signal is ready to be delivered by applying, for example, a delay equal to or greater than the oscillator stabilization time. This delay may be obtained, for example, by counting N periods of the clock signal, N being for example greater than 100, for example equal to 4,096.

An output 250 of control element 224 provides, when the clock signal has been verified, a reference clock signal (ClkOut) having the reference frequency. This signal ClkOut is for example used by a security circuit block which stores the time 230 (RTC, Real Time Clock) or may be used by other circuit blocks to generate time sequences, for example (Timer).

The resetting of control element 224 by common reset signal resetn or by reset signal ClkReArm consists, for example, of stopping signal ClkOut and setting output 224*c* to 0, which stops reference frequency generator 202. When input 224*a* is at 0, control element 224 is reset. It will remain stopped as long as input 224*a* is at 0. When input 224*a* switches to 1, circuit block 224*a* is operational again.

In operation, when detection circuit 204 is started up by control bit ClkDetEn, which is for example set to 1 in operation, it detects whether a failure is present on the signal originating from reference frequency generator 202, such as for example no signal or a wrong frequency.

When a failure is detected, signal ClkFail varies and for example switches to a high level, and a rising edge is generated. The output of logic circuit block 212 then consists of a high-level signal with a rising edge applied to flip-flop 210 on clock input 210*b*. Output 210*d* is then at state 0. Common reset signal resetn is by default at 1, whereby input 224*a* resetbar is set to 0, which triggers the resetting of control element 224.

At this stage, only a full restarting (powering up) of the circuit, or the modification of signal resetn or of signal ClkReArm can enable to restart the oscillator. However, the powering up of the circuit and the modification of signal resetn may both cause the resetting of all the functional circuit blocks 102, 104, but also the rewriting of security keys from memories. This results in latencies in the circuit use, but may also result in security issues. Thus, according to the type of failure (transient or permanent), the resetting of the different functional circuit blocks 102, 104 (case of the resetting by modification of resetn) or the resetting of circuit block 106 alone (case of the resetting by modification ClkReArm) may be preferred.

Control unit 270, which has received bit ClkFail set to 1, modifies the state of signal ClkReArm or resetn. The selection of the signal to be modified is for example performed according to the type of transient or permanent failure.

A first way of determining whether failures are transient is to count the number of times that signal ClkFail switches to 1 over a time counted with RTC module 230. This provides a failure rate which is compared with a threshold.

A second way is to check, when signal ClkFail switches to 1, whether the power supply mode of circuit 100 has been modified, for example by passing from an active mode to a very low-power mode. Indeed, this may generate oscillator power supply disturbances and potentially failures, which are linked to this change and are thus a priori transient.

To reset circuit block 106 only, thus avoiding the need to reset a plurality of functional circuit blocks external to circuit block 106, then the signal for resetting reference frequency generator circuit block ClkReArm is set to a high level with a rising edge or in the form of a pulse. In this case, signal resetn remains at 1 or at a high level. Signal ClkReArm being inverted before the "AND" function of logic circuit block 214, the reset input 210*a* of flip-flop 210 receives a falling edge transiting through 0, which enables to reset flip-flop 210 and switches its Qn output 210*d* to 1. The output signal of logic circuit block 222 ClkOK then is at 1 (or high), since resetn remains at 1. The resetting of control element 224 is then disabled, since it is only active when a signal at 0 is applied to input 224*a*.

To also reset a plurality of functional circuit blocks external to circuit block 106, for example because the signal originating from the oscillator is not present or a detected error rate is higher than a threshold, then common reset signal resetn is set to 0 or to a low level, with a falling edge. In this case, signal ClkReArm remains at 0 or at a low level. The reset input 210*a* of flip-flop 210 thus receives a falling edge transiting through 0, which enables to reset flip-flop 210 and switches its Qn output 210*d* to 1. The output signal of logic circuit block 222 ClkOK is then at 1 since resetn is at 0. The resetting 224*a* of control element 224 is then disabled, since it is only active when input 224*a* is at 0.

Figure 3:
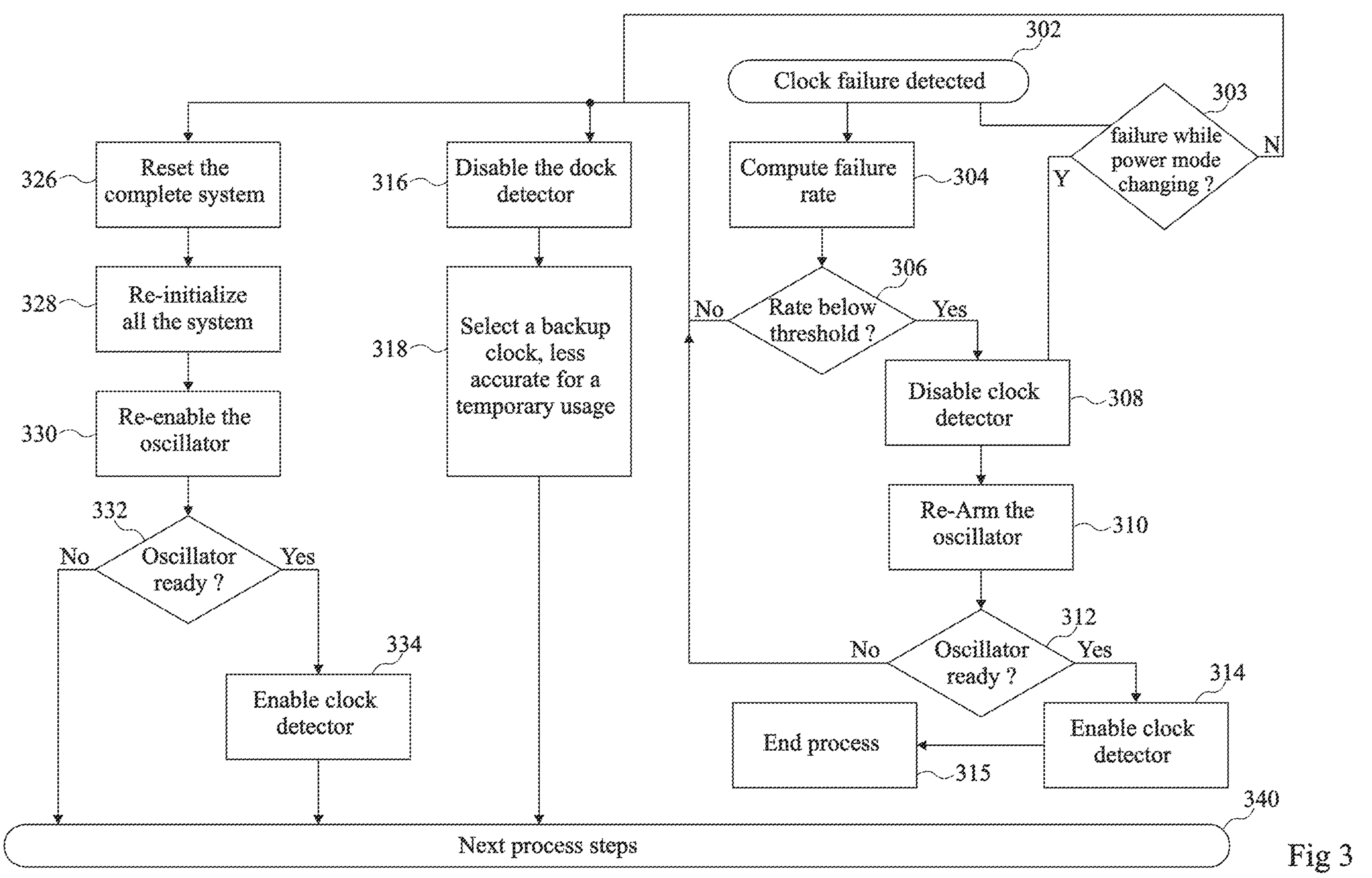
FIG. 3 very schematically shows, in the form of a flowchart, a method of controlling the circuit of FIG. 2.

FIG. 3 very schematically shows in the form of a flowchart a method of controlling the circuit of FIG. 2.

At a step 302 (Clock failure detected), a failure on the signal originating from reference frequency generator 202 is detected by the detection circuit 204.

Two steps 304 (Compute failure rate) and 303 (Failure while power mode changing?) can then be executed, in parallel, or one only, or one after the other, to estimate whether the failure is transient or permanent.

At step 303, if the failure is detected when a power supply mode of circuit 100 has changed, for example when at the passing from an active mode to a very low power mode, then the failure can be considered as transient. In this case, branch "Y" is followed towards a step 308 (Disable clock detector). In the opposite case (branch "N"), steps 316 (Disable the clock detector) or 326 (Reset the complete system) are implemented, or step 304 may be carried out (case not shown in FIG. 3).

During step 304, an error rate is determined, for example, by analysis of the number of times that signal ClkFail has switched to 1 according to the time of clock circuit block 230. The time provided by clock circuit block 230 is used, for example, to determine a failure rate per time unit by determining a relative time between two failures. This relative time is for example counted by time counters or another reference clock different from that of clock circuit block 230 since the clock of circuit block 230 stops when a failure is detected.

At a step 306 (Rate below threshold), subsequent to step 304, the error rate determined at step 304 is compared with a predetermined threshold. If the error rate is lower than this threshold (branch "Yes"), then step 308 is implemented. If not, steps 316 or 326 are implemented.

Step 308 consists of disabling detection circuit 204, for example by changing the state of bit(s) ClkDetEn and by for example switching it to 0 (if it was at 1, or conversely otherwise). Signal ClkFail is then reset to its default value at 0.

A step 310 (Re-Arm the oscillator) is then implemented where only signal ClkReArm is modified (set to 1 with a rising edge), signal resetn remaining at 1. The input 210*a* of flip-flop 210 is then set to 0. Output 210*d* is 1. Input 224*a* of control element 224 switches to 1, which restarts control element 224. The signal SrcEn at output 224*c* switches to 1 and oscillator 202 is re-enabled.

A step 312 (Oscillator ready?) is then executed. In this step, reference signal OscClk, which is generated again and which is present at input 224*b* of control element 224, is verified over a large number of periods (for example 4,096 periods) by control element 224. If the oscillator has stabilized and no errors are detected, signal Ready is set to a state indicating that reference frequency generator 202 is ready (branch "Yes"). Reference clock signal ClkOut is then made available on output 250. A step 314 (Enable clock detector) is then implemented.

During step 314, detection circuit 204 is re-enabled, for example by the state switching of bit ClkDetEn to a high state or in the form of a pulse.

The next step 315 (End process) corresponds to the end of the process.

At step 312, in the case where signal Ready on output 260 is not detected or not detected within a given time (timeout), reference frequency generator 202 is considered as not being ready (branch "No"), and one of steps 316 (Disable the clock detector) or 326 (Reset the complete system) is then implemented.

When the branches "No" of steps 306 and 312 are followed, one of steps 316 or 326 can be implemented.

Step 316 consists of disabling detection circuit 204, for example, similarly to step 308.

A step 318 (Select a backup clock, less accurate for a temporary usage) is then executed. At step 318, an alternative clock signal is selected to be used in other subsequent processes in a subsequent step 340 (Next process steps). This alternative clock signal for example originates from an internal backup low-frequency oscillator, which enables to compensate for a failure in the reference frequency generator for a limited time.

Step 340 (Next process steps) comprises other processes to be carried out. These other processes are, for example: readjusting the time of circuit block 230, or protecting the secrets of the circuit if it is estimated that the failure may be an attack, or also requesting a powering up with the sending of bit "resetn" and, if the oscillator does not restart, the secrets, such as encryption keys, may be erased.

Step 326 consists of fully resetting the various functional circuit blocks by modifying bit resetn (for example, by setting it to 0), then restarting and resetting them at a step 328 (Re-initialize all the system). During step 328, security keys may have to be copied from memories into secure registers.

At a subsequent step 330 (Re-enable the oscillator), reference frequency generator 202 is restarted by modifying bits SrcEn and OscEn, with bit OscEn returning to 0, which corresponds to the switched-off oscillator.

Then, a step 332 (Oscillator ready?) subsequent to step 330 and similar to step 312 is carried out. At this step, if signal Ready is set to a state indicating that reference frequency generator 202 is ready (branch "Yes"), then a step 334 (Enable clock detector) is implemented. At step 334, detection circuit 204 is for example re-enabled by the state switching of bit ClkDetEn to a high state, or in the form of a pulse.

Otherwise, reference frequency generator 202 is considered as not being ready (branch "No"), and step 340 is implemented.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove. In particular, as concerns the input 224*a* of control element 224, which may be enabled by a signal at 1 or high level if logic circuit block 222 is a NAND logic circuit block.

In another example, it may be chosen to set signal ClkReArm to 0 when a restarting of circuit block 106 is necessary, if logic circuit block 214 comprises no inverter circuit at the input.

The invention claimed is:

1. An electronic circuit, comprising:

a reference clock signal generator circuit including a reference frequency generator and a detection circuit connected to an output of the reference frequency generator and configured to detect a failure on a signal generated at the output of the reference frequency generator;

functional circuits; and a control circuit configured to generate, in response to the detected failure on the signal originating from the reference frequency generator, a first reset signal applied to the reference frequency generator that causes a resetting of the reference frequency generator and a second reset signal applied to the functional circuits that causes a resetting that is common to said functional circuits and to said reference clock signal generator circuit; wherein the control circuit generates the first and second reset signals dependent on whether said failure is transient or permanent.

2. The circuit according to claim 1, further comprising:

a flip-flop clocked by a signal derived from the detected failure on the signal originating from the reference frequency generator;

a first logic circuit configured to logically combine the first and second reset signals;

said flip-flop having a reset input coupled to an output of the first logic circuit;

a second logic circuit configured to logically combine an output of the flip-flop with the second reset signal to generate a clock status signal; and the control circuit configured to control the reference frequency generator in response to the clock status signal.

3. The circuit according to claim 1, wherein the detection circuit is configured to generate a failure status signal according to a result of detecting the failure.

4. The circuit according to claim 3, wherein the reference clock signal generator circuit further comprises a flip-flop having:

a clock input configured to receive a signal dependent on the output of the detection circuit; and a reset input coupled to a first logic block that is configured to logically AND an inverse of the first reset signal and the second reset signal.

5. The circuit according to claim 4, wherein said reference clock signal generator circuit further comprises a start-up control circuit having a reset input coupled to a second logic block configured to logically AND a signal present on an inverted output of said flip-flop and said second reset signal.

6. The circuit according to claim 5, wherein the inverted output of the flip-flop is configured to be reset when the reset input is activated.

7. The circuit according to claim 5, wherein the reset input of the flip-flop is activated when it receives a signal at logic 0.

8. The circuit according to claim 5, wherein said start-up control circuit comprises an output configured to deliver a signal for controlling the reference frequency generator.

9. The circuit according to claim 8, wherein the signal for controlling the reference frequency generator is configured to stop the reference frequency generator when the reset input of the control circuit is enabled.

10. The circuit according to claim 5, wherein said start-up control circuit comprises:

a clock output configured to deliver a reference clock signal having the reference frequency; and a clock input configured to receive said signal originating from the reference frequency generator;

wherein the start-up control circuit is configured to deliver the reference clock signal at the clock output based on the signal originating from the reference frequency generator after a given number of periods have been verified.

11. The circuit according to claim 4, wherein the flip-flop is coupled to the output of the detection circuit via a third logic block configured to logically AND the failure status signal and a signal for enabling the detection circuit.

12. The circuit according to claim 4, wherein the flip-flop comprises a data input set to a logic 1 state.

13. The circuit according to claim 4, wherein the flip-flop is a D-type flip-flop.

14. A circuit, comprising:

an oscillator circuit having an input and clock output;

a detection circuit coupled to the clock output and configured to detect a failure of the oscillator circuit;

a flip-flop circuit having a clock input configured to receive a signal dependent on a clock failure signal output by the detection circuit;

a first logic circuit configured to logically combine a first reset signal indicating a circuit block reset and a second reset signal indicating a reset of only the oscillator circuit;

wherein a reset input of the flip-flop is coupled to an output of the first logic circuit;

a second logic circuit configured to logically combine an output of the flip-flop and the first reset signal to generate a clock status signal; and a controlling circuit configured to receive the clock status signal and control a logic state of a signal applied to the input of the oscillator circuit.

15. The circuit of claim 14, wherein the detection circuit further includes an enable input configured to receive a detector enable signal, and further comprising a third logic circuit controlled by the detector enable signal to pass the clock failure signal output by the detection circuit the clock input of the flip-flop.

16. The circuit of claim 14, further comprising a fourth logic circuit configured to logically combine an oscillator enable signal and an oscillator control signal generated by the controlling circuit to generate the enable signal applied to the enable input of the oscillator circuit.

17. The circuit of claim 14, wherein the oscillator circuit, the detection circuit, the flip-flop circuit, the first logic circuit, the second logic circuit, and the controlling circuit are circuit components of a reference clock signal generator circuit block, said circuit further including one or more functional circuit blocks, wherein each functional circuit block is reset in response to said first reset signal, and wherein the reference clock signal generator circuit block and said one or more functional circuit blocks are coupled by a circuit bus.

* * * * *